(12) United States Patent
Dunn et al.

(10) Patent No.: US 6,480,359 B1
(45) Date of Patent: Nov. 12, 2002

(54) HARD DISK DRIVE SUSPENSION WITH INTEGRAL FLEXIBLE CIRCUIT

(75) Inventors: Christopher G. Dunn, Austin, TX (US); Nathan P. Kreutter, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/567,783

(22) Filed: May 9, 2000

(51) Int. Cl.[7] ............................................... G11B 21/16
(52) U.S. Cl. .................................................... 360/245.9
(58) Field of Search ............................. 360/245.4–245.9

(56) References Cited

U.S. PATENT DOCUMENTS

| | | | |
|---|---|---|---|
| 5,187,625 A | 2/1993 | Blaeser et al. | |
| 5,491,597 A | 2/1996 | Bennin et al. | |
| 5,597,496 A | 1/1997 | Masaichi et al. | 216/94 |
| 5,666,717 A | 9/1997 | Matsumoto et al. | 29/603.12 |
| 5,673,484 A | 10/1997 | Masaichi et al. | 29/896.93 |
| 5,717,547 A | 2/1998 | Young | |
| 5,737,152 A | 4/1998 | Balakrishnan | |
| 5,771,569 A | 6/1998 | Inaba | 29/603.04 |
| 5,781,380 A | 7/1998 | Berding et al. | |
| 5,796,552 A | 8/1998 | Akin, Jr. et al. | |
| 5,812,344 A | 9/1998 | Balakrishnan | |
| 5,870,258 A | 2/1999 | Khan et al. | |
| 5,995,328 A | 11/1999 | Balakrishnan | |

FOREIGN PATENT DOCUMENTS

| | | |
|---|---|---|
| WO | WO 96/22597 | 7/1996 |
| WO | WO 98/14937 | 4/1998 |
| WO | WO 98/34219 | 8/1998 |

Primary Examiner—Allen Cao
(74) Attorney, Agent, or Firm—Darla P. Fonseca

(57) ABSTRACT

A disk drive suspension assembly including an elongated polymeric base member having a plurality of traces formed directly on a first surface thereof and a reference voltage layer formed on a second surface thereof. A support member is formed directly on at least a portion of the reference voltage layer. The plurality of traces overlay at least a portion of the reference voltage layer. The reference voltage layer is formed from a first electrically conductive material and the support member is formed from a second electrically conductive material. The first electrically conductive material providing substantially greater electrical conductivity and substantially less tensile strength than the second electrically conductive material. The support member includes a head gimbal portion having a first thickness and a load beam portion having a second thickness. The second thickness is substantially greater than the first thickness.

6 Claims, 9 Drawing Sheets

HARD DISK DRIVE SUSPENSION WITH INTEGRAL FLEXIBLE CIRCUIT

FIELD OF THE INVENTION

The invention disclosed herein relates generally to hard disk drive suspensions. More specifically, the invention relates to hard disk drive suspension assemblies and circuit assemblies with an integral flexible circuit and integral support member.

BACKGROUND OF THE INVENTION

Suspension assemblies in hard disk drives include a head gimbal assembly (HGA). The HGA includes a gimbal assembly, a head assembly, and an interconnect assembly. The head assembly includes a highly sensitive read/write transducer, commonly referred to as a head, attached to an air bearing slider. The head assembly also includes electrical terminals configured for interconnection to the interconnect assembly for receiving and relaying data signals. The head assembly facilitates reading and writing of information on a surface of a rotating magnetic disk. The interconnect assembly includes a plurality of transmission elements, such as wires or traces, for transmitting data to and from the head assembly. The suspension assembly positions the head assembly at a generally constant distance away from the moving surface of the rotating disk. The suspension assembly permits the head assembly to "fly" at a height above the surface of the disk, including surface irregularities.

Most conventional suspension assemblies, also referred to herein as a support member, include a load beam and a gimbal portion. The load beam is a resilient spring plate designed to provide lateral stiffness. The load beam is calibrated to apply a force on the head assembly that counteracts a lift force on the head that is provided by the air stream generated by the rotating disk. Accordingly, the head assembly flies above the surface of the disk at a height established by the equilibrium of the load beam force and the lift force.

The gimbal portion is positioned adjacent to an end of the load beam and has the head assembly attached thereto. The gimbal portion permits roll and pitch deflections of the head assembly in response to flying over surface imperfections and warping of the rotating disk. By permitting these deflections, the gimbal portion aids in maintaining the proper orientation and distance of the head assembly relative to the rotating disk, even when the load beam exhibits a slight amount of flexing and twisting.

The suspension assembly can be attached at its proximal end to a rigid arm or directly to a linear or rotary motion actuator. The actuator rapidly moves and then abruptly stops the HGA over any position on a radius of the disk. The radial HGA movement and the rotation of the disk allow the head to quickly reach every location above the disk. However, the rapid stop and go movement causes very high stresses on the HGA.

An ideal HGA comprises components low in mass. Excessive inertial momentum caused by excessive mass can cause overshoot errors. Overshoot errors occur when momentum carries the whole HGA past the intended stopping point during positioning movement. Low-in-mass HGA's are easier to move, resulting in power savings in multiple platter disk drives. Furthermore, lighter weight HGA's permit the head to be flown closer to the surface of the disk. The closer the head assembly can fly to the surface of the disk, the more densely information can be stored on the disk. Accordingly, a lightweight HGA is desirable in high performance disk drives.

It is known that the strength of a magnetic field in a disk drive varies proportionally to the square of the fly height of the head. Manufacturers of disk drives strive to reach flying clearances less than 100 nanometers, which is 0.1 micrometers. For comparison, a human hair is about 100 micrometers thick. However, the head assembly must not touch the disk, since the impact with the spinning disk, which rotates at about 10,000 rpm or faster, can damage the head and the surface of the disk.

Amplifying and control circuits process, send and receive the data signals to and from the head assembly. Signal transmission requires conductors to extend between the head assembly and the related circuitry of the disk drive. Traditional head assemblies use a read-write circuit loop with two conductors, usually copper wires encapsulated in plastic sheeting. Newer types of magnetic read-write heads, commonly referred to as magneto-resistance head assemblies, require four or more independent conductors.

The increasing need for more wires, lower disk stack height and less stiffness and mass of the suspension assembly has forced the manufacturers to consider different suspension design approaches. In one design approach, a suspension assembly has signal traces that are etched from a stainless steel based material and an insulating layer is subsequently formed over the signal traces. The stainless steel base material is also etched to form the load beam portion and head gimbal portion of the suspension. A key limitation of this type of construction is excessive yield rates due to the integrated fabrication process and poor conductivity of stainless steel. In another design approach, a conventional flex circuit is attached to a separately fabricated suspension assembly using an adhesive. A key drawback with this type of construction is the cost associated with the precision required for assembling the flexible circuit to the suspension assembly.

Designers and manufacturers of HGA's face competing and limiting design considerations. During operation, the suspension assembly should be free of unpredictable loads and biases which alter the exact positioning of the head assembly. The suspension assembly should respond instantaneously to variations in the surface topology of a disk. Alterations to the flying height of the head can significantly affect data density and accuracy and even destroy data stored on the disk if the head collides with the surface of the disk.

The rigidity and stiffness of a load beam increase in relation to the cross-sectional thickness by the third power. To respond to air stream changes and to hold the flying head at the appropriate orientation, suspension assemblies are very thin and flexible, especially around a sensitive spring portion of the load beam. Interconnect assembly conductors have a large effect on the performance of the suspension assembly. Conductor stiffness alone greatly affects the rigidity of the spring regions and flight performance.

A standard wire conductor attached atop the suspension can more than double the stiffness of a load beam and significantly limit the ability of the load beam to adjust to variations in the surface of the disk, vibrations, and movement. The effect of the conductors on a gimbal region, the thinnest and most delicate spring in the suspension assembly, is even more pronounced. Furthermore, conductors placed over spring regions of the load beam and gimbal portion of the suspension assembly must not plastically deform when the spring regions flex. Plastic deformation prevents the return of the load beam or gimbal portion to its normal position and applies a biased load on the suspension assembly.

In HGA's that use conventional wire interconnect assemblies, two to five lengths of wire to the head assembly are manually connected to the head. Fixtures are used to manage the wires while they are being bonded to the head assembly. The lengths of wire are manually shaped using tweezers and tooling assistance to form a service loop between the head assembly and the suspension assembly and to position the wire along a predetermined wire path on the suspension assembly. The wires are tacked to the suspension using an adhesive or wire capture features formed into the suspension.

Special care is taken to avoid pulling the service loop too tight or leaving it too loose. A tight service loop places an unwanted torque on the head assembly causing errors associated with the fly height. A loose service loop allows the wire to sag down and scrape the adjacent spinning disk. Both conditions are catastrophic to disk drive performance.

Throughout the process of handling the head assembly, interconnect assembly and the suspension assembly, there is a risk of damaging the wires or the delicate load beam and gimbal. Load beams or gimbals accidentally bent during the manufacturing operations are scrapped. Often the head assembly also cannot be recovered, adding additional financial losses.

Similar to conventional wire interconnect assemblies, flexible circuit interconnect assemblies may inadvertently impart unbalanced or excessive forces on the suspension. Many common flexible circuit case substrates are also hydroscopic, resulting in flexural characteristics that are dependent on moisture content and humidity. Because the flexible circuits are formed separately from the suspension and subsequently attached, precision manufacturing tolerances are difficult and costly to maintain.

Therefore, what is needed is a circuit assembly for a disk drive head suspension that provides improved fly height control, that reduces noise in signal transmission to and from the head assembly, and that can be cost effectively manufactured.

SUMMARY OF THE INVENTION

Accordingly, in one embodiment of the present invention, a circuit assembly includes a base member and a plurality of traces formed directly on a first surface of the base member. The traces extend between a first end and a second end of the base member. A reference voltage member is formed directly on a second surface of the base member. The plurality of traces is positioned to overlay at least a portion of the reference voltage member. A support member is formed directly on at least a portion of the reference voltage member.

The support member is formed from a material exhibiting a tensile strength substantially greater than the tensile strength exhibited by the reference voltage member and the traces. A preferred material for the support member is a nickel alloy such as nickel boron or nickel-phosphorus or any suitable plateable material. A preferred material for the traces is copper, gold, palladium, tin, or any suitable plateable. In a preferred embodiment, the traces and the reference voltage member are formed of the same material.

The support member is preferably formed directly on the reference voltage member using an electroless plating process. The electroless plating process is preferably an autocatalytic electroless plating process. The use of an electroless plating process contributes to providing a support member with uniform thickness and allows the support member to be made from a preferred selection of materials.

The support member may be formed to have regions of different thickness as well as regions that are completely isolated from adjacent regions thereof. A load beam portion of the support member preferably has a thickness substantially greater than a gimbal portion thereof. The load beam portion of the support member may include spaced-apart flange portions having a main portion extending therebetween. The flange portion of the support member has a thickness substantially greater than the main portion of the support member.

Circuit assemblies and suspension assemblies according to the present invention exhibit an impedance value of less than about 200 ohms between any two traces.

In another embodiment of the present invention, a process for making a circuit assembly includes the steps of forming a plurality of traces directly on a first surface of a base member, wherein the traces extend between a first end and a second end of the base member; forming a reference voltage layer directly on a second surface of the base member, wherein the plurality of traces overlay at least a portion of the reference voltage layer; and forming a support member directly on at least a portion of the reference voltage layer.

In a further embodiment of the present invention, a disk drive suspension assembly includes an elongated polymeric base member having a plurality of traces formed directly on a first surface thereof and a reference voltage member formed on a second surface thereof. A support member is formed directly on at least a portion of the reference voltage member. The plurality of traces overlay at least a portion of the reference voltage member. The reference voltage member is formed from a first electrically conductive material and the support member is formed from a second electrically conductive material. The first electrically conductive material provides substantially greater electrical conductivity and substantially lower tensile strength than the second electrically conductive material. The support member includes a head gimbal portion having a first thickness and a load beam portion having a second thickness. The second thickness is substantially greater than the first thickness.

The following terms have the following meanings when used herein:

1. The term "electroless deposition" refers to processes in which a layer of material is deposited onto a non-conductive substrate.

2. The term "electroless plating" refers to processes in which conductive features on a substrate are plated without being subjected to an externally applied current or voltage.

3. The term "autocatalytic electroless plating" refers to a process of depositing a metallic coating by a controlled chemical reduction where a reducing agent in the form of a chemical, such as sodium hypophosphite, provides the electrons.

4. The term "head suspension assembly (HGA)" refers to a structure including a gimbal assembly, a head assembly, and an interconnect assembly.

5. The term "suspension assembly" refers to a structure including a load beam portion and a head gimbal portion.

6. The term "load beam" refers to a portion of the suspension assembly that provides a flexural-induced loading relative to a longitudinal axis thereof and that exhibits negligible torsional deflection relative to the longitudinal axis.

7. The term "gimbal portion" refers to a portion of the suspension assembly that permits pitch and roll movement of the slider.

8. The term "support member" refers to a structural member including the load beam and optionally including a gimbal portion.

9. The terms "slider" and "head" are used interchangeably herein and refer to a unit for reading and writing information in a magnetic format, optical format or other type of data storage format.

10. The term "reference voltage layer" refers to a layer of electrically conductive material that is spaced away from an adjacent electrical feature by a uniform distance.

DETAILED DESCRIPTION OF THE DRAWINGS

Figure 1:
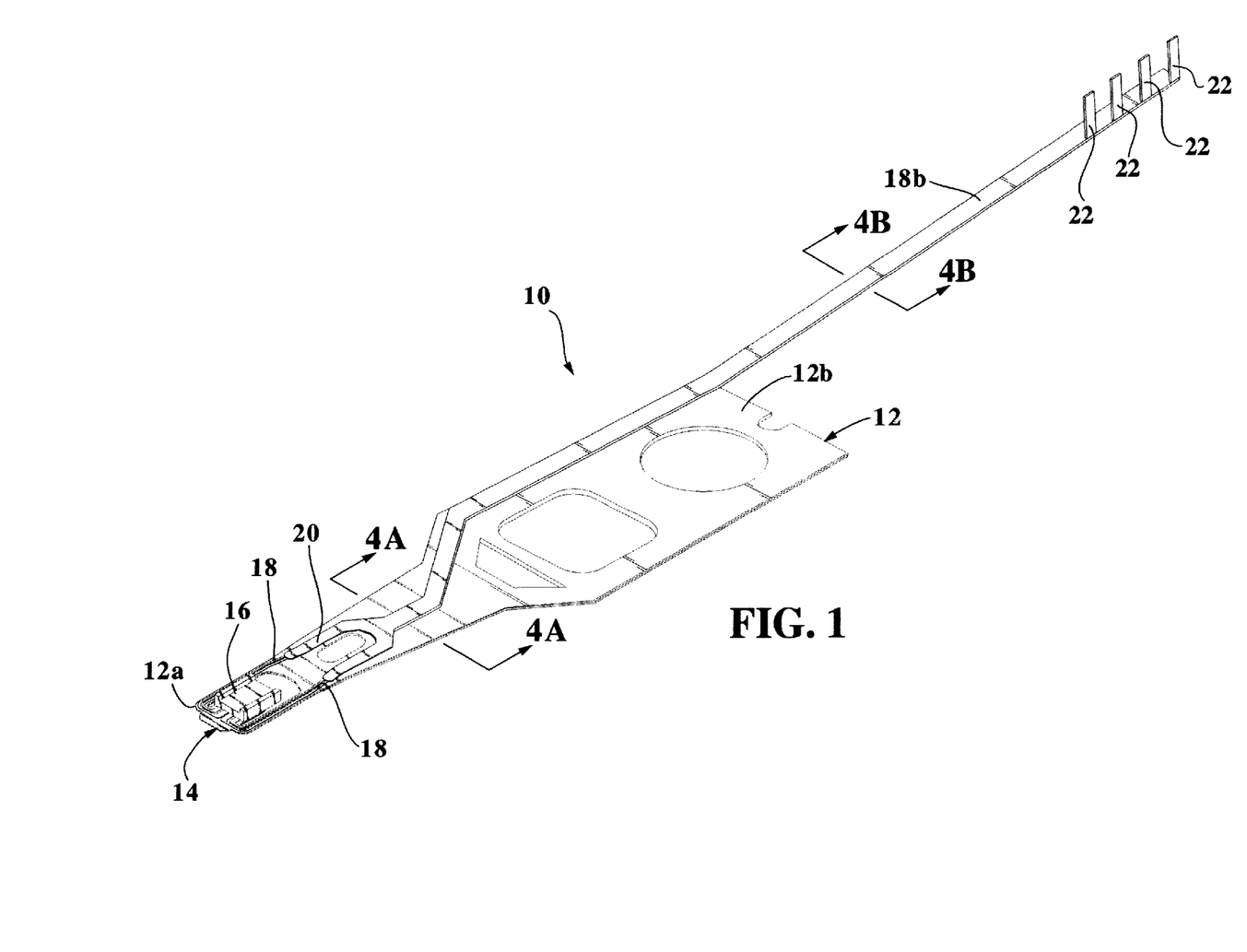
FIG. 1 is a perspective view illustrating an embodiment of a disk drive suspension assembly.
Figure 2:
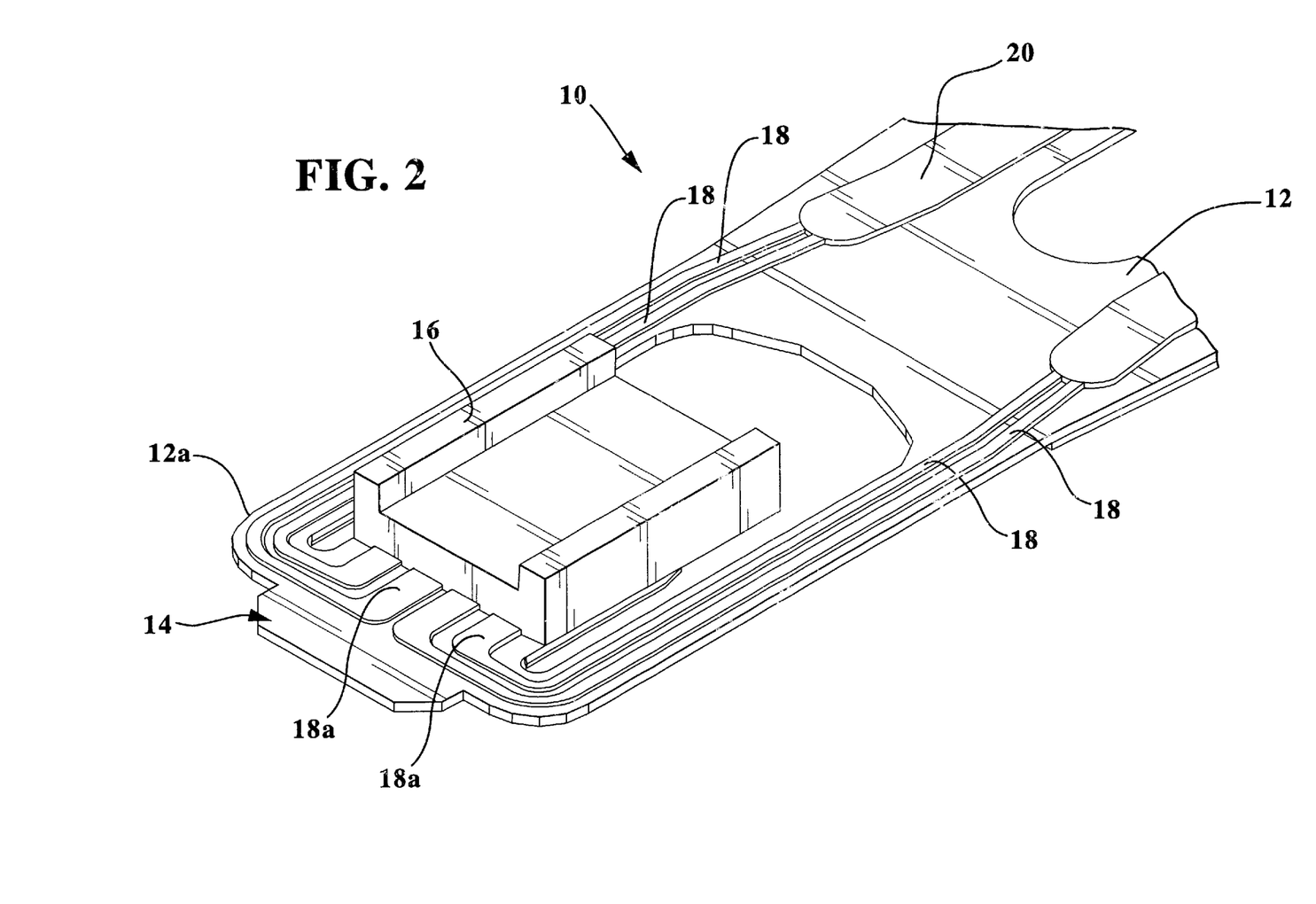
FIG. 2 is a perspective view illustrating a head gimbal portion of the disk drive suspension assembly of FIG. 1.
Figure 3:
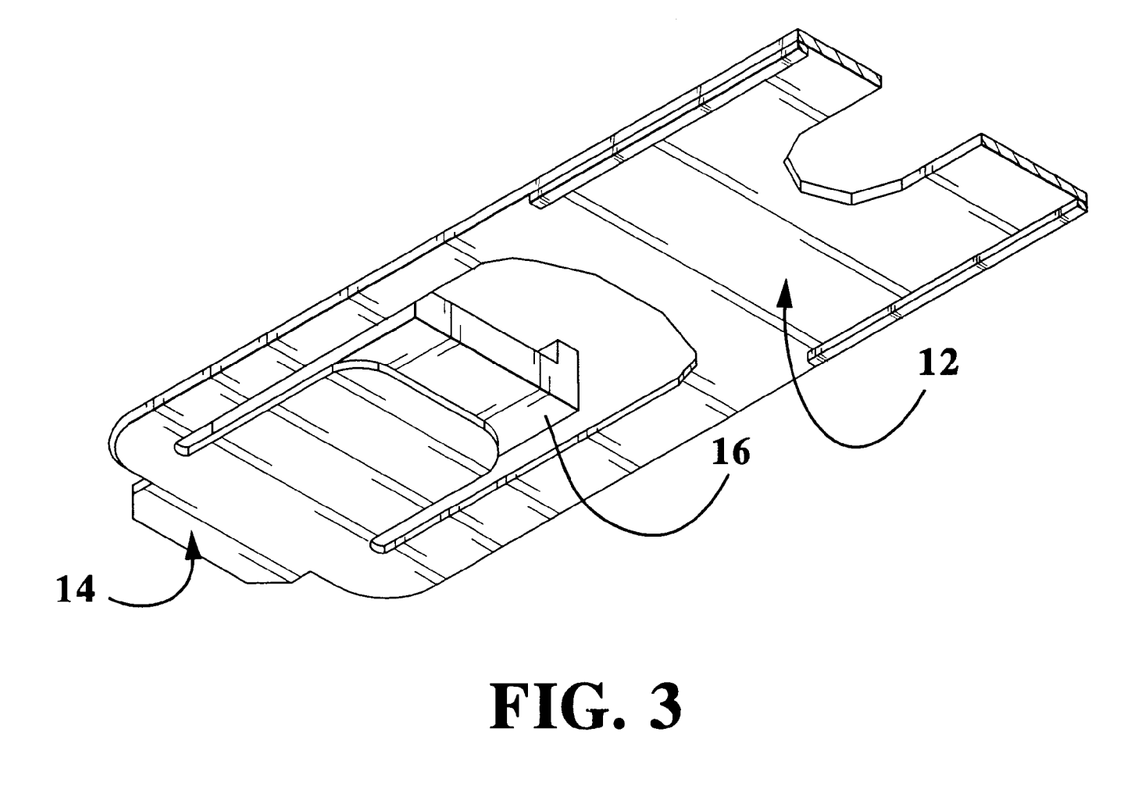
FIG. 3 is a different perspective view of the head gimbal portion of FIG. 2.

An embodiment of a suspension assembly 10 is illustrated in FIGS. 1–3. The suspension assembly 10 includes a load beam portion 12 having a first end 12a and a second end 12b. A gimbal portion 14 is attached to the first end 12a of the load beam portion 12. The gimbal portion 14 has a head assembly 16 mounted thereon.

A plurality of traces 18 is attached to the load beam portion 12. The traces 18 extend between the first end 12a and the second end 12b of the load beam portion 12. A first end 18a, FIG. 2, of each one of the traces 18 is electrically connected to corresponding terminals (not shown) of the head assembly 16. A second end 18b, FIGS. 1 and 4B, of each one of the traces 18 extends from the second end 12b of the load beam portion 12. Each one of the traces 18 includes a corresponding lead 22 for being electrically connected to a related component of a hard disk drive.

A portion of each one of the traces 18 is covered with a protective layer 20, FIGS. 1, 2, 4A and 4B, such as a non-conductive photoimageable covercoat material. Examples of suitable photoimageable covercoat materials include epoxy acrylate formulations offered by Taiyo under the PSR4000 series and by Nippon Polytech under the NPR80 series; and polyimide formulations offered by Arch Chemicals under the Probimide series and by DuPont under the Pyralin Series. An example of a suitable screen printable covercoat material for the protective layer 20 includes an epoxy formulation offered by Ashai Chemicals under the part number CCR232. The protective layer 20 reduces the potential for corrosion of the underlying portions of the traces 18. As is commonly practiced in art of circuit-making, the portions of the traces 18 that are not covered by the protective layer 20 typically have a coverplate layer (not shown) of corrosion-resistant material such as gold or palladium formed thereon.

Figure 4A:
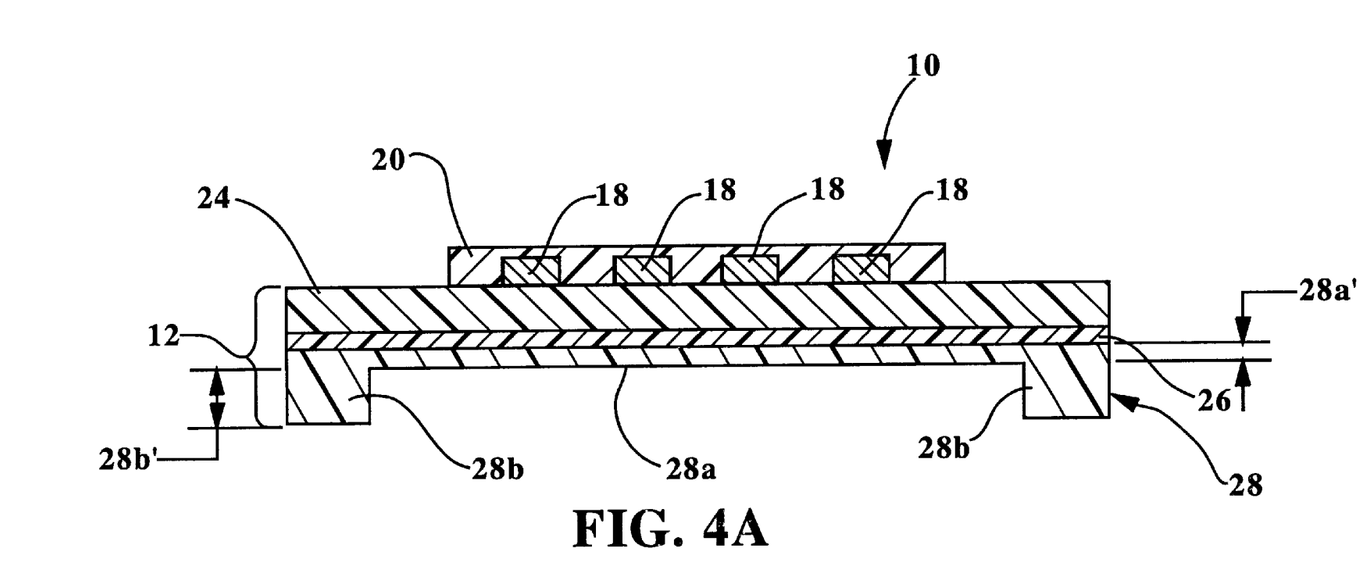
FIG. 4A is a cross-sectional view taken along the line 4A—4A in FIG. 1.

Referring to FIG. 4A, the load beam portion 12 includes a base member 24. The traces 18 are mounted directly on a first side of the base member 24. The traces 18 as well as other types of conductive features are formed from a conductive feature layer formed on the base member 24. A reference voltage member 26 is mounted directly on a second side of the base member 24. The traces 18 and the reference voltage member 26 are preferably mounted directly on the respective first and second sides of the base member 24. By being mounted directly on a surface, it is meant that an attachment layer such as a layer of adhesive is not used between the base member 24 and the traces 18 or the reference voltage member 26. A support member 28 is mounted on a surface of the reference voltage member 26 opposite the second side of the base member 24. The support member 28 includes a main portion 28a having spaced apart flange members 28b extending therefrom. The flange members have a thickness 28b' that is substantially greater than a thickness 28a' of the main portion 28a.

The base member 24 is typically a flexible polymeric substrate having a thickness of from about 0.25 mils to about 3.0 mils. The specific application and design of the suspension assembly 10 will dictate the required thickness of the base member 24. Suitable materials for the base member 24 include a polyimide film such as that sold by DuPont under the tradename KAPTON E. Other types of commercially available flexible polymeric films, such as, for example, films made of polyester and polypropylene, may also be useful as materials for the base member 24.

The conductive traces 18 and the reference voltage member 26 are preferably made of a conductive material such as copper. Preferred materials for the conductive traces 18 and the reference voltage member 26 have a tensile strength of less than about 60,000 psi and a resistance of less than about 1.7 $\mu\Omega$/cm at room temperature. The conductive traces 18 and the reference voltage member 26 may include a plurality of layers of the conductive material. For example, a first layer of copper may be formed on the base member 24 using a deposition method, such as sputtering, and a second layer of copper may be formed on the first layer of copper using a plating process, such as electroplating or electroless plating. Depending on the application, the overall thickness of the conductive traces 18 and the reference voltage member 26 is typically from about 50 micro inches to about 1000 micro inches. The specific application and design of the suspension assembly 10 will dictate the required thickness of the conductive traces 18 and the reference voltage member 26.

The support member 28 is preferably made of a material having mechanical properties superior to the material of the traces 18 and reference voltage member 26. The mechanical properties of the support member 28 dominate the resulting overall stiffness of the load beam portion 12 of the suspension assembly 10. Depending on the stiffness and spring properties required in a given application, the typical thickness of main portion 28a of the support member 28 is from about 0.1 mils to about 1.5 mils. The support member 28 may include one or more flanged portions that are substantially thicker than the main portion thereof.

Preferred materials for the support member 28 include nickel-based alloys, such as nickel-phosphorus alloys and nickel-boron alloys. Preferred nickel-based alloys have a tensile strength of greater than about 90,000 psi.

In most conventional suspension assemblies and circuit assemblies, stainless steel is the preferred material for the support member. However, stainless steel cannot be readily and reliably plated. Accordingly, support members 28 according to the present invention are made of plateable materials such as nickel based alloys. In addition to being plateable, nickel-based alloys have material characteristics very similar to stainless steel.

In suspension assemblies and circuit assemblies according to the present invention, the configuration and construction of the reference voltage member 26 relative to the traces 18 provide a highly controlled impedance level. The material that the reference voltage member 26 is made from has significantly higher electrical conductivity than that of the materials from which the support member 12 and conventional load beams are made. Furthermore, because the traces 18 and the reference voltage member 26 are formed directly on the respective first and second surfaces of the base member 24, the distance between the reference voltage member 26 and the traces 18 is more uniform when compared to previous types of constructions. These structural features contribute to enhanced impedance performance.

Figure 4B:
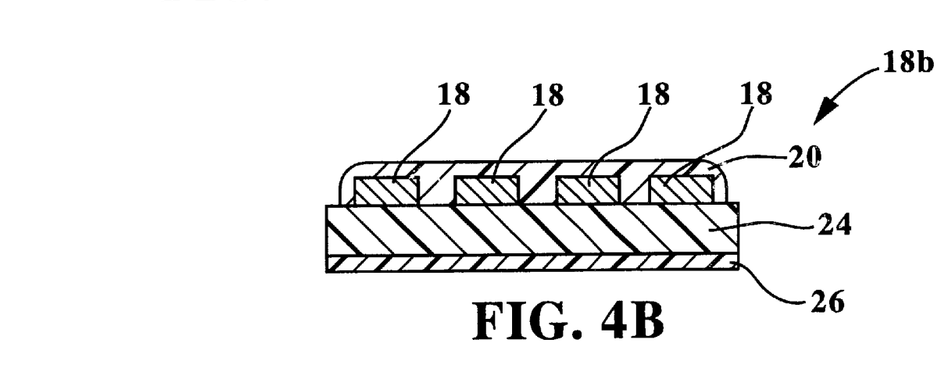
FIG. 4B is a cross-sectional view taken along the line 4B—4B in FIG. 1.

As illustrated in FIG. 4B, the second end 18b of the traces 18 that extend from the second end 12b of the load beam 12 are carried on the first side of the base member 24. The reference voltage member 26 is carried on the second side of the base member 24. The protective layer 20 is formed over the traces 18. It is desirable that the traces 18 extending from the second end 12b of the load beam 12 exhibit a minimal degree of stiffness. Accordingly, the support member 28 does not extend past the second end 12b of the load beam 12.

Figures 5, 6:
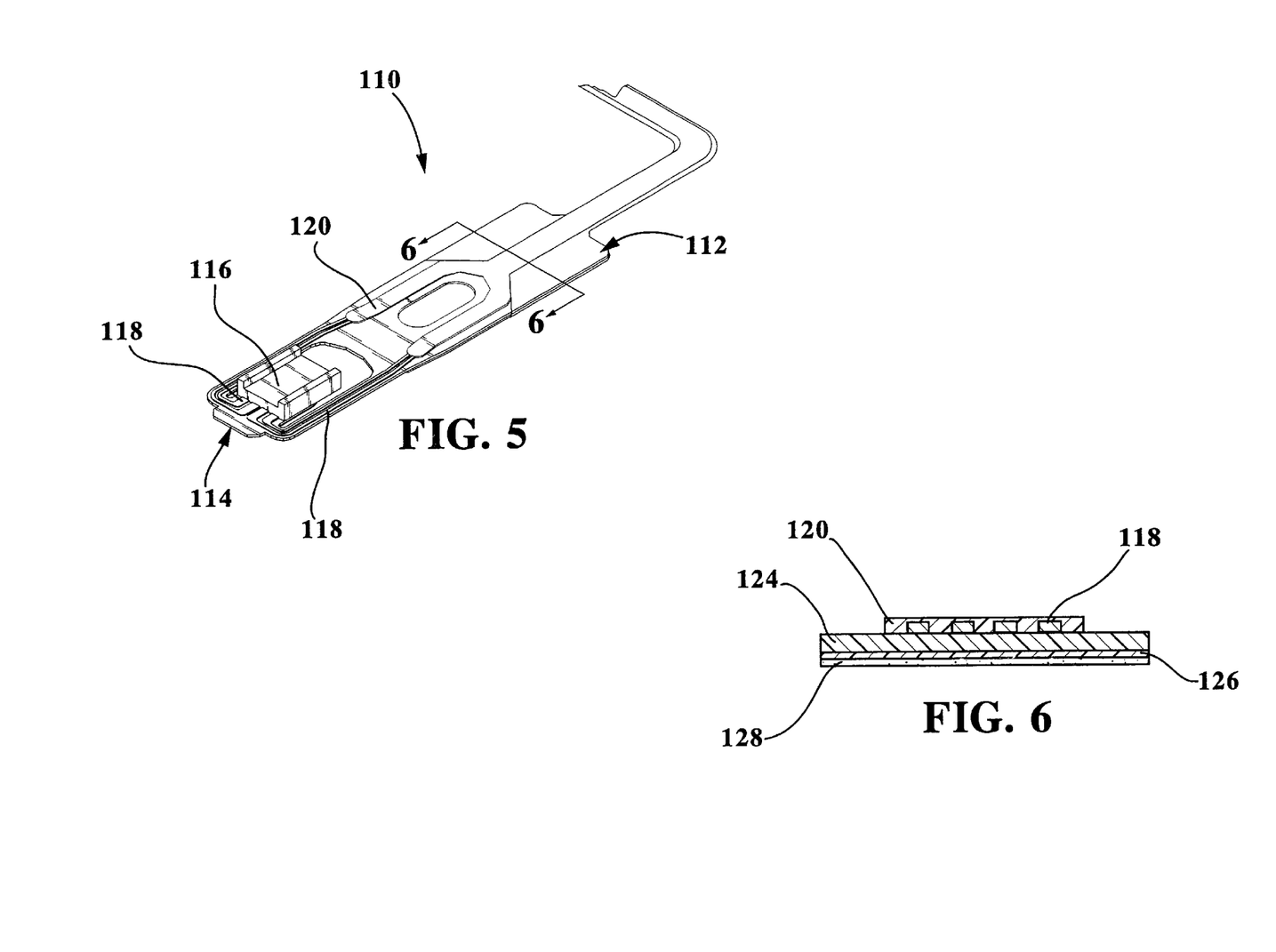
FIG. 5 is a perspective view illustrating a disk drive circuit assembly for use with a conventional disk drive load beam.
FIG. 6 is a cross-sectional view taken along the line 6—6 in FIG. 5.

Referring now to FIGS. 5 and 6, an embodiment of a circuit assembly 110 according to the present invention is illustrated. The circuit assembly 110 is made according to processes of the present invention. In use, the circuit assembly 110 is mounted on a conventional load beam (not shown) for providing electrical interconnection between a head assembly 116 and the associated electrical components of a hard disk drive (not shown). Additionally, the circuit assembly 110 includes a gimbal portion 114 for providing gimballing functional. The circuit assembly 110 may optionally include a support member 128 for providing a suitable degree of stiffness. An advantage of using the circuit assembly 110 in conjunction with a conventional load beam is that the thickness of the gimbal portion 114 can be significantly less than the thickness of a gimbal portion of a conventional load beam. Accordingly, control of the movement of the head assembly 116 is improved.

The circuit assembly 110 includes a base member 124. A plurality of traces 118 are formed directly on a first side of the base member 124 and a reference voltage member 126 is formed directly on a second side of the base member 124. A protective layer 120 is formed over the traces 118. The support member 128 is formed directly on the reference voltage member 126.

Figure 7A:
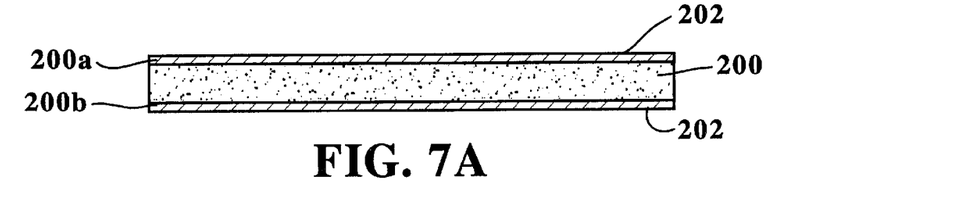
FIGS. 7A–7N and 7P are serial views illustrating an embodiment of a step-by-step process for fabricating a suspension assembly and a circuit assembly according to the present invention.
Figure 7B:
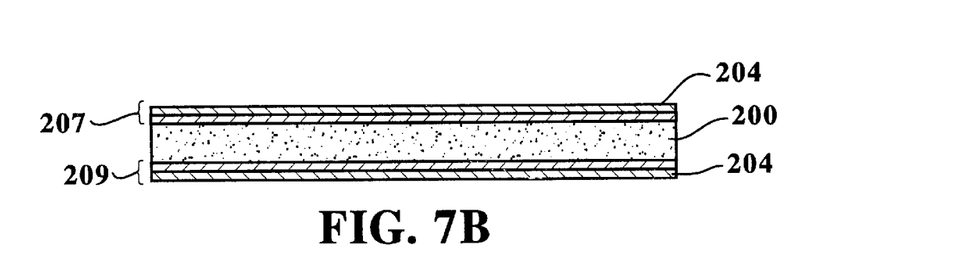
Figure 7C:
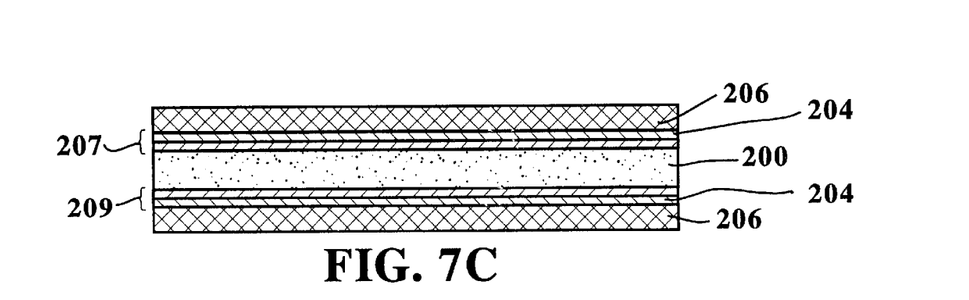
Figure 7D:
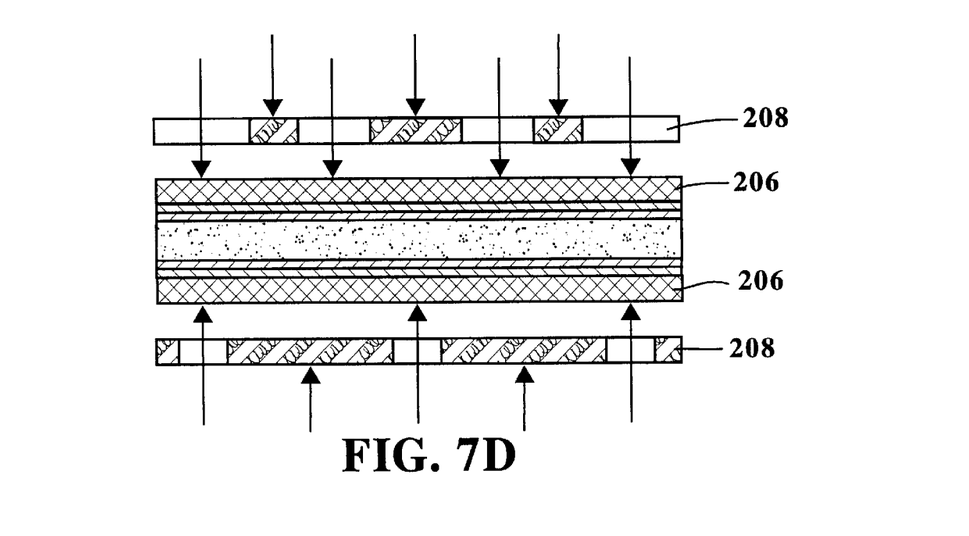
Figure 7E:
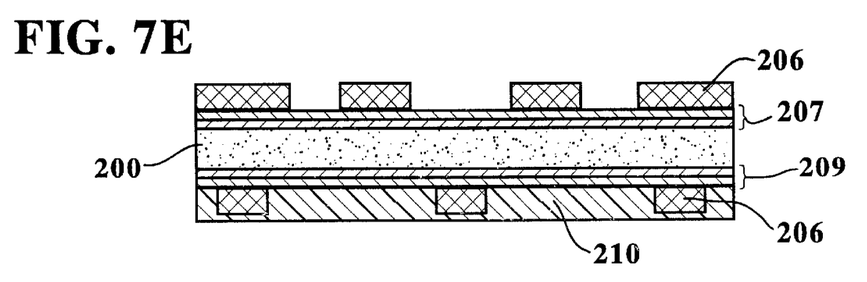
Figure 7F:
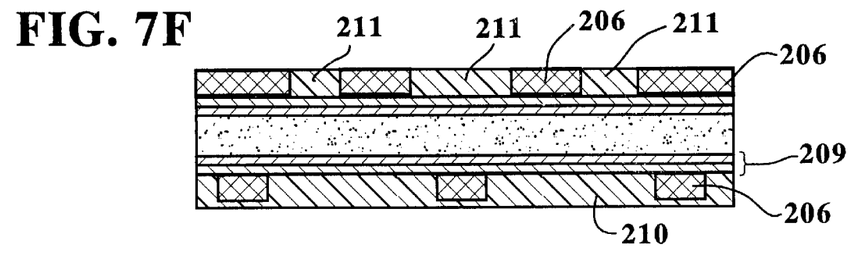
Figure 7G:
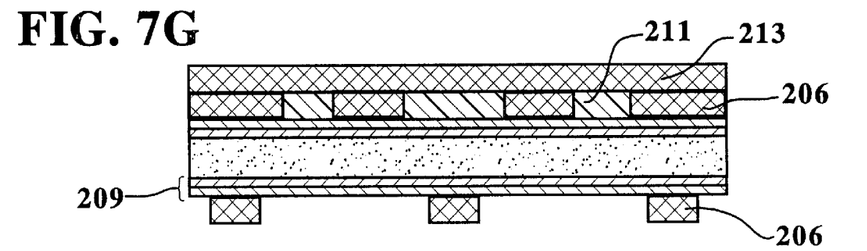
Figure 7H:
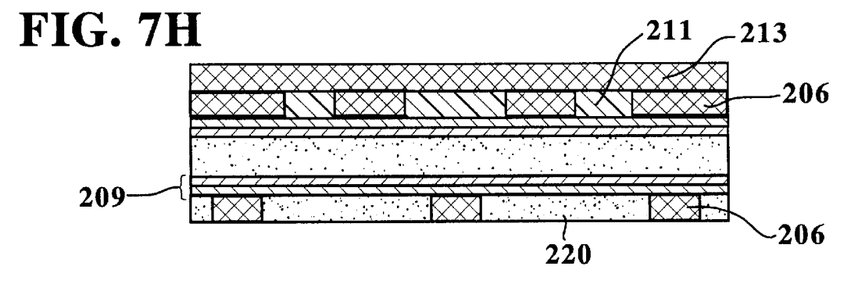
Figure 7I:
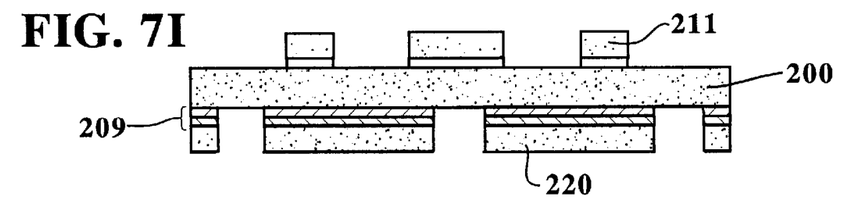
Figures 7J, 7K:
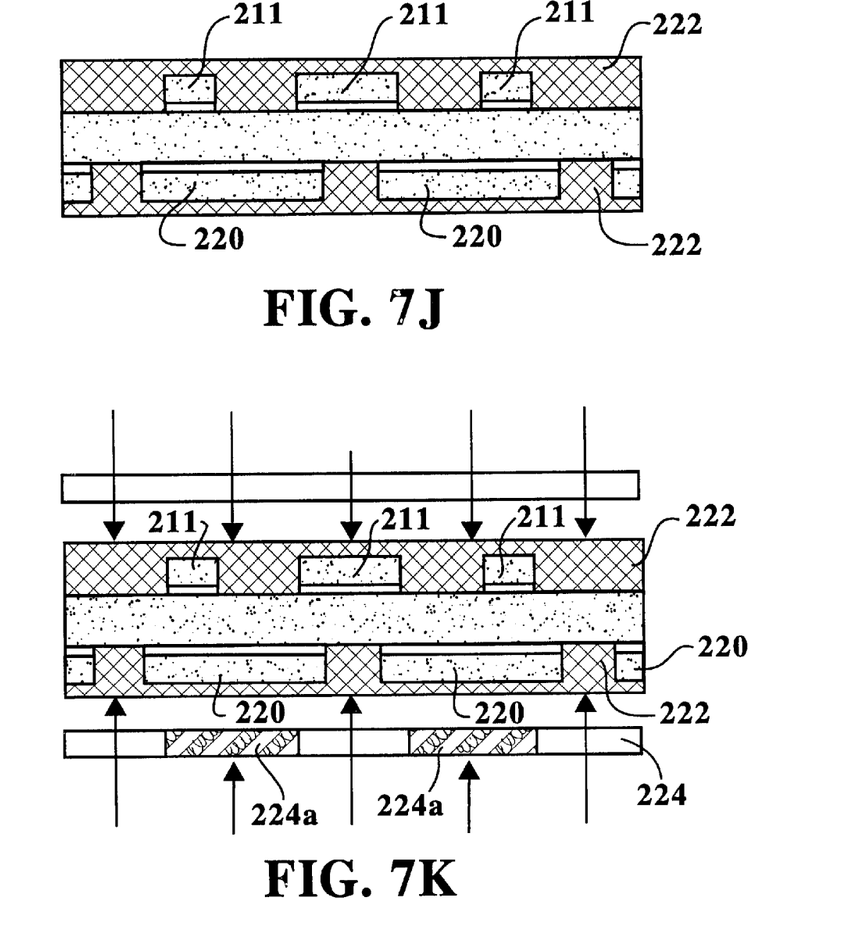
Figure 7L:
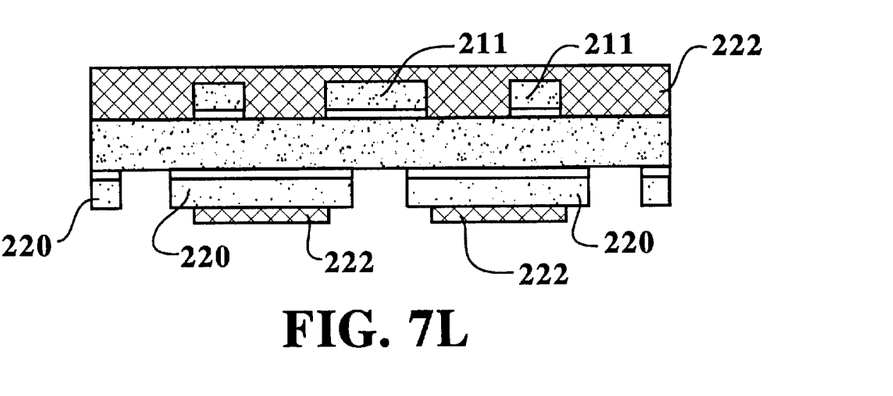
Figure 7M:
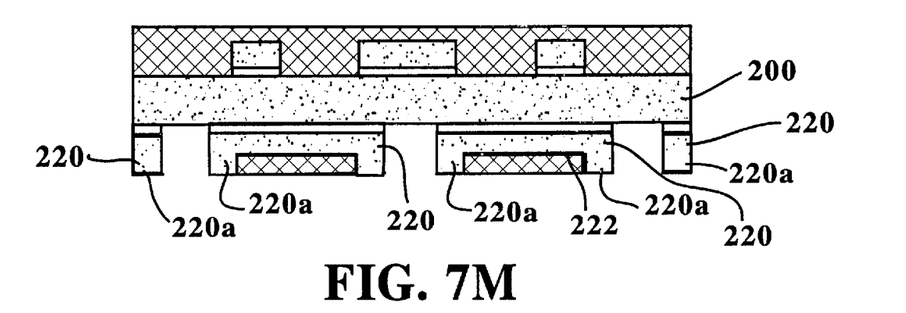
Figure 7N:
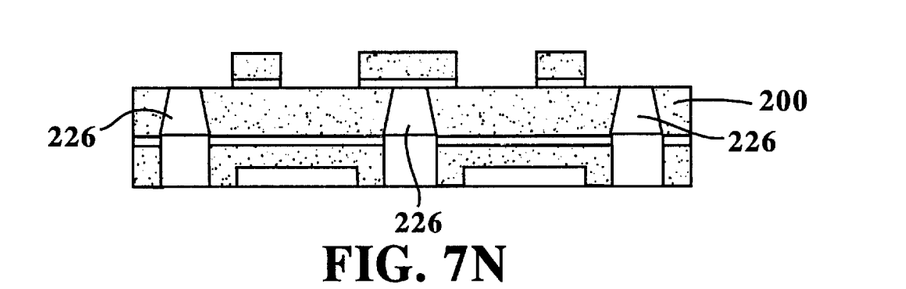
Figure 7P:
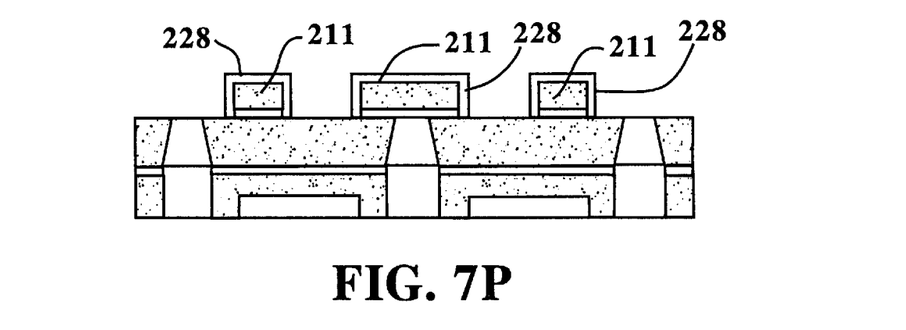

A process for making suspension assemblies and circuit assemblies according to the present invention is illustrated in FIGS. 7A–7N and 7P. A first side 200a and a second side 200b of a base substrate 200 are metallized using a known deposition process, such as electroless, sputtering or chemical vapor deposition, with a first conductive layer 202, commonly referred to as a seed layer, FIG. 7A. The base substrate 200 is preferably a flexible polymeric film such as polyimide. In a preferred embodiment, the first conductive layer 202 has a thickness of between about 200 angstroms and about 2000 angstroms and is made from a highly conductive material such as copper.

The first conductive layer 202 provides a continuous conductive layer to facilitate deposition of a second conductive 204, FIG. 7B. The second conductive layer 204, commonly referred to as a flash plated layer, is also made of a highly conductive material such as copper. The first and second conductive layers 202, 204 on the first side 200a of the base substrate 200 jointly define a conductive feature base layer 207, FIG. 7B. The first and second conductive layers 202, 204 on the second side 200b of the base substrate 200 jointly define a reference voltage layer 209.

The second conductive layer 204 is deposited using a known plating process, including processes such as electroless plating or electroplating techniques. A preferred method is electroplating and a typical plated thickness of the second conductive layer 204 is between about 50 micro inches and about 1000 micro inches.

In instances where the second conductive layer is copper, copper is electroplated from a copper sulfate & sulfuric acid plating solution. The plating current density is maintained between about 10 and about 60 amps per square foot.

Following the formation of the conductive feature base layer 207 and the reference voltage layer 209, an etching process is performed thereon to prepare the surfaces thereof for application of a photoresist. Typical etching solutions for copper include, but are not limited to, ammonium, sodium persulfate and hydrogen peroxide sulfuric.

A photoresist layer 206 is then applied to the conductive feature base layer 207 and to the reference voltage layer 209, FIG. 7C. In a preferred embodiment, the photoresist layer 206 is an aqueous processible, dry-film, positive-acting photoresist applied using heat and pressure. The thickness of the photoresist 206 is typically between about 15 micrometers and about 50 micrometers. Suitable photoresists for the photoresist layer 206 include, for example, photoresists offered by MacDermid Incorporated under the series designations SF, CF, and MP. Specific examples include MacDermid SF310 and MP413 photoresists.

After lamination of the photoresist 206, suitable photomasks 208 are engaged against the photoresist layers 206 and the photoresist layers 206 are then exposed to energy from a suitable source for exposing a desired image in the photoresist layer 206, FIG. 7D. An ultraviolet light source is commonly used for exposing images in photoimageable photoresists, such as those photoresist materials identified above. The photomasks 208 include patterned chrome or emulsion coated portions for preventing the transmission of energy to specific areas of the photoresist layer 206, allowing energy to pass through and react with the photoresist layer 206 in unblocked areas. Photomasks of various constructions are commercially available.

Following exposure of the photoresist layer 206, areas of the photoresist layer 206 that are not exposed to energy can be developed in a suitable developing solution. In a preferred embodiment where an aqueous positive-acting photoresist layer 206 is used, the areas not having been exposed to energy from the light source are developed out (removed) during the developing step, resulting in a desired circuit pattern in the photoresist layer 206, FIG. 7E. In the case of aqueous processible photoresists, the developing step includes applying a dilute aqueous solution, such as a 0.5%–1.5% sodium or potassium carbonate solution, to the photoresist until the desired patterns are obtained in the layers of photoresist layers 206. The developing step is typically performed using commercially available equipment and solutions.

Following the developing step, areas of the conductive feature base layer 207 that are exposed through the photoresist layer 206 are ready for plating, FIG. 7E. To prevent plating on the reference voltage layer 209, a protective layer 210, is applied over the developed photoresist layer 206 on the reference voltage layer 209. One example of a suitable protective layer 210 is a polymeric sheet held in place by a layer of commercially available, releasable adhesive. The polymeric sheet and adhesive are selected from materials that are resistant to the plating chemistry. After the protective layer 210 has been applied, exposed portions of the conductive feature base layer 207 are plated, FIG. 7F, to produce a plurality of conductive features 211 such as traces, bonding pads, capture pads, test pads, etc. Suitable plating methods include the same method used to plate the second conductive layer 204. A preferred method for plating is electroplating and a preferred material is copper. The thickness of the conductive features 211 is typically between about 0.2 mils and about 2.0 mils.

Following plating of the conductive features 211, FIG. 7G, the protective layer 210 is removed and a protective layer 213, such as a positive acting photoresist layer, is applied over the conductive features 211.

Next, the reference voltage layer 209 is subjected to an etching process to remove any oxidation. Typical etching solutions for copper include, but are not limited to, ammonium, sodium persulfate and hydrogen peroxide sulfuric.

Following the etching process, FIG. 7H, a support member layer 220 is formed on the reference voltage layer 209. The support member layer 220 is formed on the reference voltage layer 209 using a suitable plating process. A preferred plating process is an electroless, preferably autocatalytic, plating process. Specific information relating to electroless autocatalytic plating is provided in ASTM B374. Preferred plating materials include nickel-based alloys such as a nickel-phosphorus alloy having a phosphorus content of from about 5% to about 15% and a nickel-boron alloy having a boron content of from about 0.3% to about 10%.

A typical electroless autocatalytic plating process includes exposing the reference voltage layer 209 to a plating bath comprising a nickel-phosphorus alloy solution maintained at a temperature of between about 170 degrees F. and 200 degrees F. and having a pH level of between about 4.2 and about 6.2. The nickel concentration is maintained between 0.05 and 1 oz/gal of nickel concentration. The phosphorous is include with a reducing agent and deposits in the plated metal at a rate of 5.0 to 7.0 wgt %.

Following plating of the support member layer 220, FIG. 7I, the photoresist layers 206 and 213 are removed using the previously mentioned photoresist stripping method. Then, the portions of the conductive feature base layer 207 and reference voltage layer 209 that were concealed under the corresponding photoresist layer are removed using a suitable etching process, such as the etching processes described above. By etching previously concealed portions of the conductive feature base layer 207 and reference voltage layer 209, the conductive features become electrically isolated from each other.

In order to achieve superior performance characteristics, a suspension assembly or a circuit assembly may require additional torsional rigidity or apertures extending through the base substrate 200. FIGS. 7J–7P illustrate suitable process steps for adding additional thickness to selected portion of the support member layer 220 and for forming apertures through the base substrate 200.

As illustrated in FIG. 7J, a photoresist layer 222 is formed over the conductive features 211 and the support member layer 220. In a preferred embodiment, the photoresist layer 222 is made from the same material as the photoresist layer 206, described above in reference to FIG. 7C. Next, as illustrated in FIG. 7K, the photoresist layer 222 is exposed and developed using the same exposure and develop methods described above in reference to FIGS. 7D and 7E. The photoresist layer 222 adjacent to the conductive features 211 is flood exposed such that it remains in its entirety after the developing step. The photoresist layer 222 adjacent to the support member layer 220 is exposed through a photomask 224 that includes energy blocking portions 224a that are aligned with the support members 220. The energy blocking portions 224a are configured such that after exposure and developing of the corresponding photoresist layer 222, the remaining exposed portions of the photoresist layer 222 cover only a portion of the support member layer 220, FIG. 7L.

Next, as illustrated in FIG. 7M, the support member layer 220 is subjected to an additional plating process. The additional plating process produces raised portions 220a formed on the previously plated portions of the support member layer 220. The plating process of FIG. 7M is preferably the same plating process as described above in reference to FIG. 7H. Following the plating process, FIG. 7N, the photoresist layers 222 are removed.

Next, apertures 226 through the base substrate 200, FIG. 7N, are formed therein using a variety of different methods. Suitable methods for forming include mechanical punching, laser ablation, laser drilling, and chemical milling. In a preferred embodiment, the base substrate 200 is a polyimide film and the apertures 226 are formed using a suitable chemical milling process. The chemical milling process includes exposing the polyimide base substrate 200 to a concentrated base solution such as potassium hydroxide (KOH) at a temperature of from about 50° C. to about 120° C. In doing so, portions of the base substrate 200 exposed to the base solution are etched, producing the apertures 226.

Lastly, as illustrated in FIG. 7P, a coverplate layer 228 is formed on the conductive features 211 to provide enhanced performance characteristics such as corrosion resistance and bond strength. Suitable materials for the coverplate layer 228 include gold, palladium, tin and nickel. Several methods are known in the art for depositing the coverplate layer 228.

A hard disk drive suspension assembly according to the present invention improves control of the suspension stiffness in three ways. First, the thickness of a plated suspension is much less than current suspensions. Conventional suspensions having a stainless steel support member start to reach a minimum thickness limit at approximately 1 mil to about 0.5 mil using current rolling and stamping techniques. Second, the thickness of support members according to the present invention can be tailored to achieve a number of specific design requirements, such as by controlling the dwell time of the assembly in the plating bath. Third, regional stiffness of the support member can be tailored through the specific plating process.

Improved head fly characteristics are achieved through greater design freedom in attaining precise regional stiffness and torsion characteristics. Conventional load beams are formed from a continuous piece of stainless steel material. This type of construction does not permit isolated islands or multiple material thickness. With a plated suspension according to the present invention, the base member allows the support member to include islands. This additional design characteristic allows the overall and regional stiffness and torsional characteristics of the suspension assemblies to be tailored. The ability to precisely control the torsion and stiffness characteristics of a suspension assembly is essential. Such control allows the head to respond faster and in a more controlled manner to changes in the surface profile of the disk. By improving this control, the head assembly can be positioned closer to the disk without increasing the potential of the head contacting the disk. By flying the head assembly closer to the disk, the quantity of information stored on a disk can be increased.

Many conventional suspension assemblies include a separately fabricated flexible circuit that is attached to a load beam using an adhesive such as an epoxy. This type of fabrication technique is currently done by hand. Accordingly, it is labor intensive and susceptible to significant process variations. Suspension assemblies according to the present invention significantly reduce fabrication time and process variation.

Suspension assemblies and circuit assemblies according to the present invention also exhibit improved manufacturability. The reference voltage layer and conductive feature layer increase the stability of the web during processing, making the web easier to process. Furthermore, because the thickness of the support member can be reduced over conventional suspension assemblies, the thickness of the polymeric base substrate can be optimized for processing. Suspension assemblies according to the present invention have a construction that counteracts coefficient of thermal expansion (CTE) mismatches, reducing stress-induced curling.

As the data transmission rates in hard drives increase, suspension assemblies and related circuit assemblies will need to provide highly controlled impedance characteristics. Current suspension assemblies provide only limited impedance control due to significant variability in the distance between the traces and reference voltage member. In suspension assemblies that use a conventional stainless steel load beam as a reference voltage layer, impedance characteristics are also adversely affected by the poor conductivity of stainless steel. When a separately fabricated flexible circuit is used in a suspension assembly to electrically connect the head assembly to the related electronic components, variations in the spacing between the flexible circuit and the reference voltage member adversely affect impedance characteristics.

By forming the reference voltage layer and the traces directly on the base substrate in the present invention, the spacing between the traces and the reference voltage layer is precisely controlled. Also, in preferred embodiments according to the present invention, the reference voltage layer is made from a highly conductive material and the support member is made from a material providing essential mechanical properties. These design characteristics significantly improve the impedance performance of suspension assemblies and circuit assemblies according to the present invention.

Accordingly, it is appropriate that the appended claims be construed broadly and in a manner consistent with the scope of the embodiments and descriptions disclosed herein.

What is claimed is:

1. A circuit assembly for a disk suspension assembly, comprising:
   a base member;
   a plurality of traces formed directly on a first surface of the base member, the traces extending between a first end and a second end of the base member;
   a reference voltage layer formed directly on a second surface of the base member, the plurality of traces overlaying at least a portion of the reference voltage layer; and
   a support member formed directly on at least a portion of the reference voltage layer,
   wherein the reference voltage layer is formed from a first electrically conductive material and the support member is formed from a second electrically conductive material, and wherein the first electrically conductive material provides substantially greater electrical conductivity and substantially less tensile strength than the second electrically conductive material.

2. A circuit assembly for a disk suspension assembly, comprising:
   a base member;
   a plurality of traces formed directly on a first surface of the base member, the traces extending between a first end and a second end of the base member;
   a reference voltage layer formed directly on a second surface of th base member, the plurality of traces overlaying at least a portion of the reference voltage layer; and
   a support member formed directly on at least a portion of the reference voltage layer, wherein the support member includes a first portion having a first thickness and a second portion having a second thickness, the second thickness being substantially greater the first thickness.

3. A circuit assembly for a disk suspension assembly, comprising:
   a base member;
   a plurality of traces formed directly on a first surface of the base members, the traces extending between a first end and a second end of the base member;
   a reference voltage layer formed directly on a second surface of the base member, the plurality of traces overlaying at least a portion of the reference voltage layer; and
   a support member formed directly on at least a portion of the reference voltage layer, wherein the support member is formed from a material having a tensile strength of greater than about 90,000 psi and wherein the ground plane is formed from a material having a tensile strength of less than about 60,000 psi.

4. A circuit assembly for a disk suspension assembly, comprising:
   a base member;
   a plurality of traces formed directly on a first surface of the base member, the traces extending between a first end and a second, end of the base member;
   a reference voltage layer formed directly on a second surface of the base member, the plurality of traces overlaying at least a portion of the reference voltage layer, and
   a support member formed directly on at least a portion of the reference voltage layer,
   wherein the support member includes a load beam portion and a head gimbal portion, wherein the load beam portion includes flange portions having a first thickness and the gimbal portion has a second thickness, the first thickness being substantially greater than e second thickness.

5. A process for making a circuit assembly for a disk suspension assembly, comprising the steps of:
   forming a plurality of traces directly on a first surface of a base member wherein the traces end between a first end and a second end of the base member;
   forming a reference voltage layer directly on a second surface of the base member wherein the plurality of traces overlay at least a portion of the reference voltage layer; and forming a support member directly on at least a portion of the reference voltage layer, wherein the step of forming the support member includes the steps of forming a first portion of the support member to have a first thickness and forming a second portion of the support member to have a second thickness wherein the second thickness is substantially greater than the first thickness.

6. A disk drive suspension assembly, comprising:

an elongated polymeric base member;

a plurality of traces formed directly on a first surface of the base member;

a reference voltage layer formed directly on a second surface of the base member, the reference voltage layer formed from a first electrically conductive material and the plurality of traces overlaying at least a portion of the reference voltage layer; and a support member formed directly on at least a portion of the reference voltage layer, the support member formed from a second electrically conductive material, the first electrically conductive material providing substantially greater electrical conductivity and substantially lower tensile strength than the second electrically conductive material, the support member including a head gimbal portion having a first thickness and a flange portion having a second thickness, the second thickness being substantially greater than the first thickness.

* * * * *

UNITED STATES PATENT AND TRADEMARK OFFICE
CERTIFICATE OF CORRECTION

PATENT NO.    : 6,480,359 B1
DATED         : November 12, 2002
INVENTOR(S)   : Dunn, Christopher G.

It is certified that error appears in the above-identified patent and that said Letters Patent is hereby corrected as shown below:

Column 9,
Line 49, "71" should read -- 7I --.

Column 12,
Line 58, "greater than e second" should read -- greater than the second --

Signed and Sealed this

Sixth Day of May, 2003

JAMES E. ROGAN
*Director of the United States Patent and Trademark Office*